United States Patent
Bash et al.

(10) Patent No.: US 7,730,731 B1
(45) Date of Patent: Jun. 8, 2010

(54) REFRIGERATION SYSTEM WITH SERIAL EVAPORATORS

(75) Inventors: Cullen E. Bash, Los Gatos, CA (US); Abdlmonem Beitelmal, Palo Alto, CA (US); Ratnesh K. Sharma, Union City, CA (US); Chandrakant D. Patel, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1148 days.

(21) Appl. No.: 11/264,773

(22) Filed: Nov. 1, 2005

(51) Int. Cl.
*F25B 41/00* (2006.01)
*F25B 49/00* (2006.01)

(52) U.S. Cl. .................. 62/198; 62/225; 62/228.4; 62/259.2

(58) Field of Classification Search .......... 62/180, 62/198, 228.4, 259.2, 199, 200, 225
See application file for complete search history.

(56) References Cited

U.S. PATENT DOCUMENTS

| | | | |
|---|---|---|---|
| 3,334,681 A | 8/1967 | Mazorol et al. | |
| 4,997,031 A | 3/1991 | Kashiwada et al. | |
| 5,186,020 A | 2/1993 | Rockenfeller et al. | |
| 5,673,568 A * | 10/1997 | Isshiki | 62/228.4 |
| 5,706,668 A | 1/1998 | Hilpert | |
| 5,791,983 A | 8/1998 | Robertson | |
| 6,164,369 A | 12/2000 | Stoller | |
| 6,182,742 B1 | 2/2001 | Takahashi et al. | |
| 6,415,619 B1 * | 7/2002 | Bash et al. | 62/228.4 |
| 6,490,877 B2 | 12/2002 | Bash et al. | |
| 6,574,104 B2 | 6/2003 | Patel et al. | |
| 6,628,520 B2 | 9/2003 | Patel et al. | |
| 6,662,865 B2 | 12/2003 | Beitelmal et al. | |
| 6,672,381 B2 | 1/2004 | Beitelmal et al. | |
| 6,772,604 B2 | 8/2004 | Bash et al. | |
| 6,775,997 B2 | 8/2004 | Bash et al. | |
| 6,786,056 B2 | 9/2004 | Bash et al. | |
| 6,832,489 B2 | 12/2004 | Bash et al. | |
| 6,832,490 B2 | 12/2004 | Bash et al. | |
| 6,834,512 B2 | 12/2004 | Bash et al. | |
| 6,854,284 B2 | 2/2005 | Bash et al. | |
| 6,868,683 B2 | 3/2005 | Bash et al. | |
| 6,945,058 B2 | 9/2005 | Bash et al. | |
| 6,981,915 B2 | 1/2006 | Moore et al. | |
| 7,010,392 B2 | 3/2006 | Bash et al. | |
| 7,086,459 B2 | 8/2006 | Beitelmal et al. | |
| 7,248,942 B2 | 7/2007 | Bash et al. | |
| 2002/0066283 A1 * | 6/2002 | Oh et al. | 62/259.2 |

(Continued)

FOREIGN PATENT DOCUMENTS

JP    2002333160    11/2002

*Primary Examiner*—Marc E Norman

(57) ABSTRACT

A refrigeration system for controlling airflow around an air-cooled heat generating device includes a variable speed compressor. The refrigeration system also includes evaporators positioned along a refrigerant line in a serial configuration with respect to each other and are positioned directly in at least one of the path of airflow supplied into the heat generating components and the path of airflow exhausted from the heat generated components. The refrigeration system further includes a controller and at least one temperature sensor. The temperature sensor is configured to transmit signals related to the detected temperature to the controller, and the controller is configured to vary the speed of the variable speed compressor based upon the signals received from the temperature sensor.

13 Claims, 8 Drawing Sheets

U.S. PATENT DOCUMENTS

| | | |
|---|---|---|
| 2002/0124585 A1 | 9/2002 | Bash et al. |
| 2003/0010051 A1 | 1/2003 | Lecke et al. |
| 2003/0085025 A1 | 5/2003 | Woods et al. |
| 2004/0020226 A1 | 2/2004 | Bash et al. |
| 2004/0050231 A1 | 3/2004 | Chu et al. |
| 2004/0079101 A1* | 4/2004 | Beitelmal et al. .......... 62/259.2 |
| 2004/0100770 A1* | 5/2004 | Chu et al. .................... 361/698 |
| 2004/0221604 A1 | 11/2004 | Ota et al. |
| 2005/0122685 A1 | 6/2005 | Chu et al. |
| 2005/0207116 A1 | 9/2005 | Yatskov et al. |
| 2005/0278070 A1 | 12/2005 | Bash et al. |
| 2006/0272342 A1 | 12/2006 | Bash et al. |

* cited by examiner

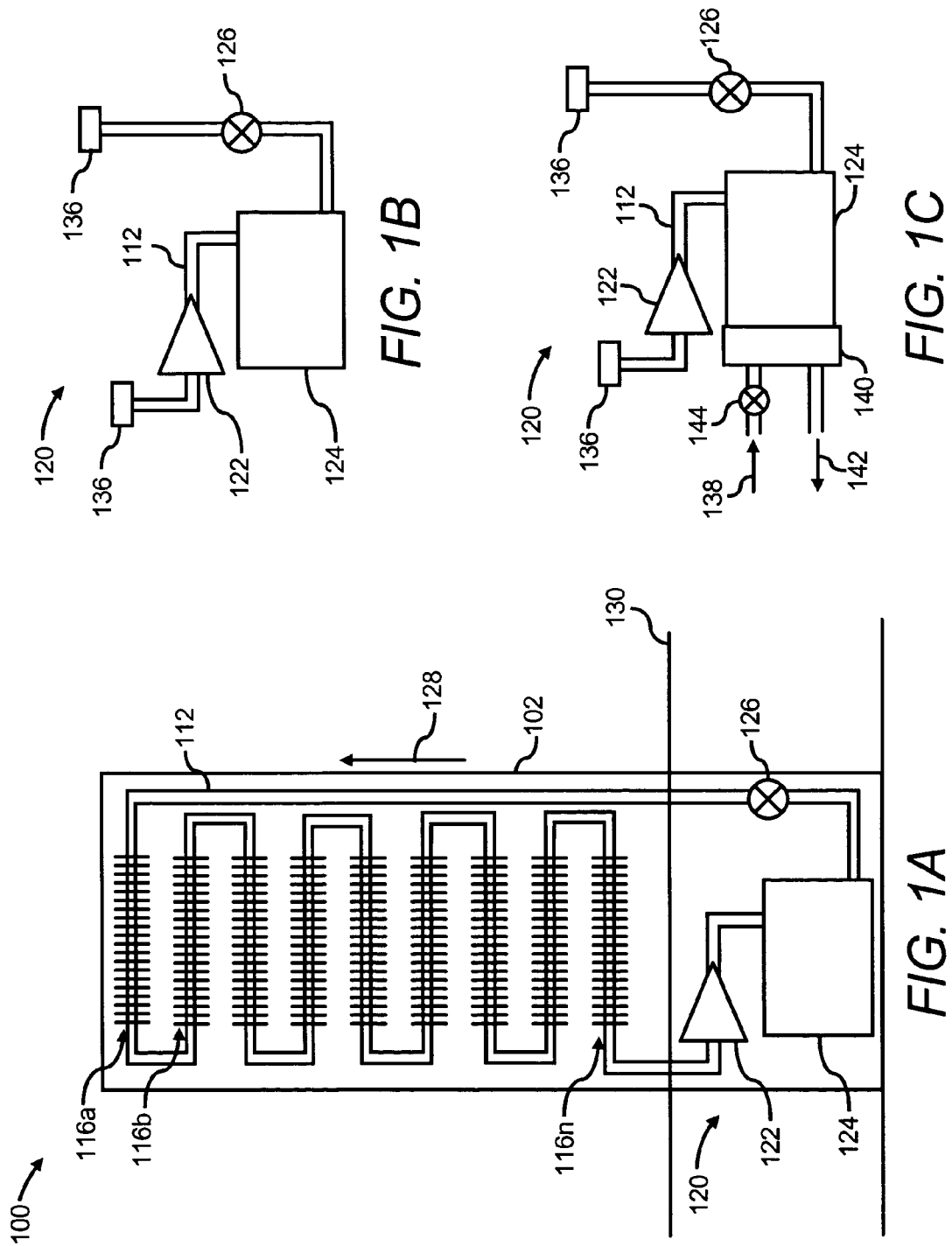

US 7,730,731 B1

REFRIGERATION SYSTEM WITH SERIAL EVAPORATORS

BACKGROUND

A data center may be defined as a location, for instance, a room that houses computer systems arranged in a number of racks. A standard rack, for instance, an electronics cabinet, is defined as an Electronics Industry Association (EIA)' enclosure, 78 in. (2 meters) wide, 24 in. (0.61 meter) wide and 30 in. (0.76 meter) deep. These racks are configured to house a number of computer systems, about forty (40) systems, with future configurations of racks being designed to accommodate 200 or more systems. The computer systems typically dissipate relatively significant amounts of heat during the operation of the respective components. For example, a typical computer system comprising multiple microprocessors may dissipate approximately 250 W of power. Thus, a rack containing forty (40) computer systems of this type may dissipate approximately 10 KW of power.

Some of the racks contained in the data center may dissipate greater levels of heat as compared to other racks in the data center. This may occur, for instance, in situations where some of the racks contain greater densities of computer systems or a larger number of computer systems that are operating at higher levels. Conventional data centers are typically equipped with a raised floor with static ventilation tiles configured to provide cool air to the computer systems from a pressurized plenum in the space below the raised floor. In most instances, the level and temperature of the airflow supplied through the ventilation tiles is the same or similar for all of the ventilation tiles. As such, those racks that dissipate greater levels of heat often receive cooling airflow that is insufficient to maintain the temperatures of the computer systems contained therein within predefined parameters. This may lead to a shutdown or damage to the computer systems.

It would thus be desirable to ensure that the computer systems in the racks receive airflow at sufficient levels and at adequate temperatures.

SUMMARY

A refrigeration system for controlling airflow around an air-cooled heat generating device having heat generating components is disclosed herein. The refrigeration system, includes a variable speed compressor for controlling the flow of refrigerant through a refrigerant line. The refrigeration system also includes evaporators positioned along the refrigerant line in a serial configuration with respect to each other. The evaporators are also positioned directly in at least one of the path of airflow supplied into the heat generating components and the path of airflow exhausted from the heat generated components. The refrigeration system further includes a controller for controlling the speed of the variable speed compressor and at least one temperature sensor positioned to detect temperatures at one or more locations with respect to the heat generating device. The temperature sensor is also configured to transmit signals related to the detected temperature to the controller, and the controller is configured to vary the speed of the variable speed compressor based upon the signals received from the temperature sensor.

BRIEF DESCRIPTION OF THE DRAWINGS

Features of the present invention will become apparent to those skilled in the art from the following description with reference to the figures, in which:

FIG. 1A shows a simplified schematic illustration of a refrigeration system, according to an embodiment of the invention;

FIG. 1B shows a cooling system portion of the refrigeration system shown in FIG. 1A, according to an embodiment of the invention;

FIG. 1C shows a cooling system portion of the refrigeration system shown in FIG. 1A, according to another embodiment of the invention;

DETAILED DESCRIPTION

Figure 1D:
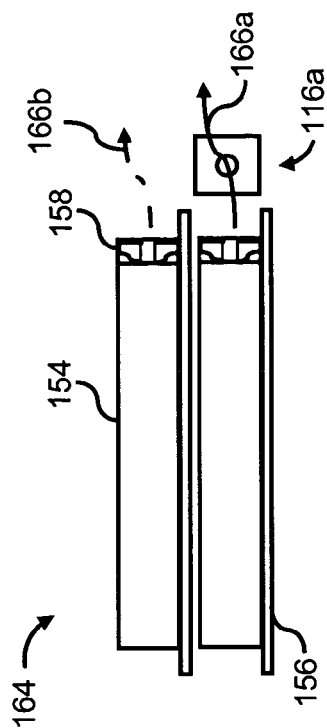
FIGS. 1D-1F depict respective side views, partially in cross section, of three positions at which evaporators may be positioned with respect to components in the refrigeration system depicted in FIG. 1A, according to embodiments of the invention.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Broadly speaking, airflow characteristics around various sections of an air-cooled heat generating device may be individually controlled through implementation of the refrigeration system described herein below. The various sections may comprise locations in a front or rear of the heat generating device. Thus, characteristics of air flowing into the heat generating device, characteristics of air flowing out of the heat generating device, or both, may be modified. The various sections may also comprise different levels of the heat generating device, different locations within a heat generating device, etc. More particularly, the granularity at which the airflow characteristics are modified may also be controlled.

The characteristics of the airflow may be modified through use of evaporators positioned directly in the path of the airflow around the heat generating device. In a first example, the evaporators are positioned near inlets of the heat generating device, such that, the evaporators are in the paths of the airflow flowing into the heat generating device. In this example, the evaporators generally operate to reduce the temperature of the airflow flowing into the heat generating device.

In a second example, the evaporators are positioned near the outlets of the heat generating device, such that, the evaporators are in the path of the airflow exhausting from the heat generating device. In this example, the evaporators generally operate to reduce the temperature of the airflow exhausted from the heat generating device. In one regard, the reduction of the exhaust air temperature may reduce the overall temperature of the air in a room housing the heat generating device, for instance. As such, the airflow that may be recirculated, that is, exhausted air that is drawn into the heat generating device, may be at a lower temperature, thereby relatively increasing the ability of the airflow to remove heat from the components in the heat generating device.

In a third example, the evaporators are positioned near both the inlets and outlets of the heat generating device. This configuration of heat exchangers may be implemented in a heat generating device having a relatively high power density, for instance, in excess of 15 kW.

In any of the examples described above, the refrigeration systems may be employed as part of a cooling system that is supplemental to a cooling system of a room. Thus, for instance, substantially only those heat generating devices having relatively high power densities, for instance, in excess of 15 kW, may be equipped with the refrigeration systems. In one regard, the refrigeration systems may be employed to generally ensure that the temperatures of the airflow supplied to the components in the heat generating devices are at rated levels. In another regard, the refrigeration systems may be employed to generally ensure that the temperatures of the airflow supplied into or exhausted from the heat generating device are uniform for a plurality of heat generating devices.

With reference first to FIG. 1A, there is shown a simplified schematic illustration of a refrigeration system 100, according to an example. It should be readily apparent to those of ordinary skill in the art that the refrigeration system 100 depicted in FIG. 1A represents a generalized illustration and that other components may be added or existing components may be removed or modified without departing from a scope of the refrigeration system 100. For example, the refrigeration system 100 may include any number of evaporators, valves, and various other components.

The refrigeration system 100 is generally configured to manipulate airflow temperatures around various sections of a heat generating device 102 configured to be air-cooled. By way of example, the heat generating device 102 may comprise a standard electronics cabinet configured to house a plurality of components capable of generating/dissipating heat (not shown), for instance, processors, micro-controllers, high-speed video cards, memories, semi-conductor devices, and the like. The components may be elements of a plurality of subsystems (not shown), for instance, computers, servers, hard drives, monitors, memories, etc. The subsystems and the components, hereinafter called heat generating components, may be implemented to perform various electronic, for instance, computing, switching, routing, displaying, and the like, functions.

The heat generating components may be arranged in the heat generating device 102 in any reasonably suitable manner. For instance, the heat generating components may be positioned horizontally on respective levels of the heat generating device 102. In addition, or alternatively, the heat generating components may be positioned vertically on respective levels of the heat generating device 102, such that a number of heat generating components are arranged on the respective levels of the heat generating device 102.

The refrigeration system 100 may be employed to substantially control the temperature of the airflow supplied into the heat generating device 102 to cool the heat generating components housed in the heat generating device 102. In addition, or alternatively, the refrigeration system 100 may be employed to substantially control the temperature of the airflow exhausted from the heat generating device 102. In the first instance, the refrigeration system 100 may be positioned upstream and directly in the path of a cooling airflow supplied into the heat generating device 102. In the second instance, the refrigeration system 100 may be positioned downstream and directly in the path of the airflow exhausted from the heat generating device 102. The refrigeration system 100 may be positioned to cool the airflow exhausted from the heat generating device 102 in situations, for instance, where there is a relatively high level of heated air infiltration into the cooling airflow supplied into the heat generating device 102 or into other heat generating devices.

In any respect, the refrigeration system 100 includes a refrigerant line 112 through which a refrigerant flows. The refrigerant line 112 generally forms a continuous loop to extend over a relatively large portion of the heat generating device 102. Positioned along the refrigerant line 112 at various heights with respect to the heat generating device 102 are evaporators 116a-116n, where "n" is an integer equal to or greater than one. In this regard, the evaporators 116a-116n are positioned in a serial arrangement with respect to each other along the refrigerant line 112. Although a plurality of evaporators 116a-116n have been illustrated in FIG. 1A, it should be understood that any reasonably suitable number of evaporators, including a single evaporator 116a, may be employed to cool the heat generating device 102 or the components housed therein.

The evaporators 116a-116n may comprise any reasonably suitable configuration designed to cool airflow with a refrigerant. Suitable evaporators may be obtained from, for instance, LYTRON, Inc., of Woburn, Mass., THERMOTEK Co., of Lakeville, Minn., and MODINE MANUFACTURING Co. of Racine, Wis. In addition, the choice of refrigerant employed in the refrigeration system 100 may depend upon a plurality of factors, including, for instance cooling requirements, environmental impact, cost, etc. Generally speaking, suitable refrigerants include the suite of vapor compression hydrocarbon refrigerants (CFC's, HCFSs, HFCs, or any blend of pure refrigerants). Suitable refrigerants may include, for instance, R134a, R290, R600, and the like.

As shown, the evaporators 116a-116n include structures, such as, fins, or other structures having relatively large surface areas, for cooling airflow that passes by the evaporators 116a-116n. Thus, as the airflow passes by the evaporators 116a-116, the airflow is cooled through transfer of heat into the refrigerant flowing through the evaporators 116a-116n. In addition, the amount of heat removed from the airflow may substantially be controlled through control of the refrigerant flowing through the evaporators 116a-116n. More particularly, a valve 126 is positioned along the refrigerant line 112 to regulate the flow of refrigerant through the evaporators 116a-116n.

In operation, the valve 126 may enable a greater amount of refrigerant flow through the evaporators 116a-116n to enable a greater amount of heat transfer from the airflows to the refrigerant, to thereby reduce the temperatures of the airflows. Alternatively, the valve 126 may be operated to reduce the refrigerant flow through the evaporators 116a-116n to reduce the amount of heat transfer from the airflows to the refrigerant. The valve 126 may also comprise various types of valves depending upon the configuration of the refrigeration system 100. For instance, the valve 126 may comprise a thermostatic expansion valve or an electronic expansion valve, both of which are described in greater detail herein below with respect to FIGS. 3 and 5, respectively.

In operation, the refrigerant flows through the evaporators 116a-116n and absorbs heat from the airflow around the evaporators 116a-116n. The heated refrigerant flows through a cooling system 120, where the refrigerant is cooled and supplied back through the evaporators 116a-116n. As shown in FIG. 1A, the cooling system 120 includes a compressor 122, which comprises a variable speed compressor. The compressor 122 is considered to be a "variable speed" compressor because the compressor 122 may be controlled to either increase or decrease the mass flow rate of refrigerant flow through the compressor 122. In other words, the variable speed compressor 122 may operate to pressurize the refrigerant to various levels.

The refrigerant exiting the variable speed compressor 122 flows through a condenser 124 and then through the valve 126 before being supplied back through the evaporators 116a-116n, as shown by the arrow 128. A more detailed description of the devices comprised in the cooling system 120 is set forth herein below with respect to FIGS. 3 and 5.

As also shown in FIG. 1A, the cooling system 120 is depicted as forming part of the heat generating device 102. As such, for instance, the cooling system 120 may be integrally formed with the heat generating device 102. Alternatively, however, the cooling system 120, including the evaporators 116a-116n, may be positioned with respect to an existing heat generating device 102. In either case, the cooling system 120 may be positioned at various other locations with respect to the heat generating device 102 without departing from a scope of the refrigeration system 100. For instance, the cooling system 120 may be positioned on a top or middle portion of the heat generating device 102, outside of the heat generating device 102, in a different heat generating device, etc. As such, the depiction of the cooling system 120 being located beneath a raised floor 130 is for purposes of illustration and it should thus be understood that the cooling system 120 may also be positioned above the raised floor 130.

Alternatively, the cooling system 120 may comprise a module separate from part of the refrigerant line 112 and the evaporators 116a-116n. More particularly, for instance, as shown in FIG. 1B, the cooling system 120 includes connectors 136 for removably connecting the refrigerant line 112 of the cooling system 120 to the remaining refrigerant line 112 through which the evaporators 116a-116n receive refrigerant. The connectors 136 may comprise any reasonably suitable and commercially available dripless disconnects. For instance, the connectors 136 may comprise couplings available from AEROQUIP Corporation or FASTER Inc, both of Maumee, Ohio.

The connectors 136 may be employed, for instance, in configurations where the evaporators 116a-116n are positioned on a movable door of the heat generating device 102. More particularly, for instance, the connectors 136 may be employed to enable the cooling system 120 to be disconnected from the evaporators 116a-116n when the door of the heat generating device 102 is opened.

Although not shown, the condenser 124 may include one or more fans to cool the refrigerant by causing a forced airstream to flow through the condenser 124. In addition, or alternatively, and as shown in FIG. 1C, the condenser 124 may be cooled through heat transfer with a chilled fluid source (as indicated by the arrow 138). The chilled fluid source may comprise a source located outside of the room in which the heat generating device 102 is located. As shown, the condenser 124 is in thermal contact with a heat exchanger portion 140 of the chilled fluid source and is therefore configured to draw heat from the refrigerant as the refrigerant flows through the condenser 124. The heated fluid flows out of the heat exchanger portion 140 as indicated by the arrow 142. The amount of chilled fluid delivered through the heat exchanger portion 140 may be controlled through operation of a valve 144 configured to meter the chilled fluid flow. In one respect, the valve 144 may be manipulated to meter the flow of fluid therethrough to substantially optimize the efficiency of the compressor 122.

Alternatively, the fluid source (as indicated by the arrow 138) may also comprise a refrigerant loop or another type of cooling loop. As such, the fluid source is not required to comprise a chilled fluid loop, but may comprise other types of cooling loops without departing from a scope of the refrigeration system 100 described herein.

The cooling system 120 may also be configured to cool refrigerant of at least one set of evaporators (not shown) positioned on a heat generating device different from the heat generating device 102. In this regard, the refrigerant line of the at least one other set of evaporators may also flow through the cooling system 120 to thereby cool the refrigerant flowing through the at least one other set of evaporators.

Figure 1E:
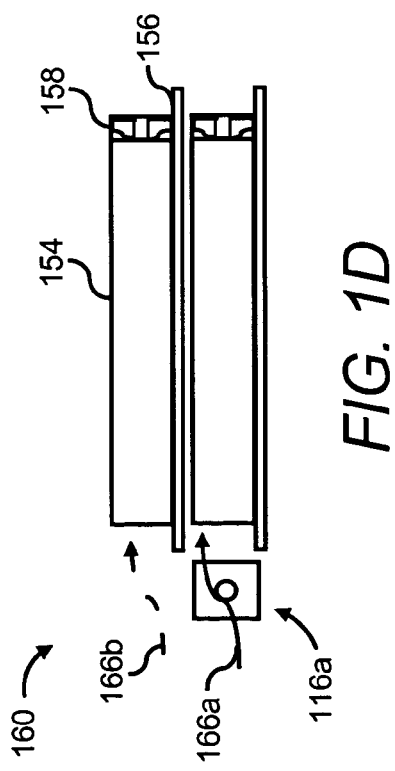
Figure 1F:
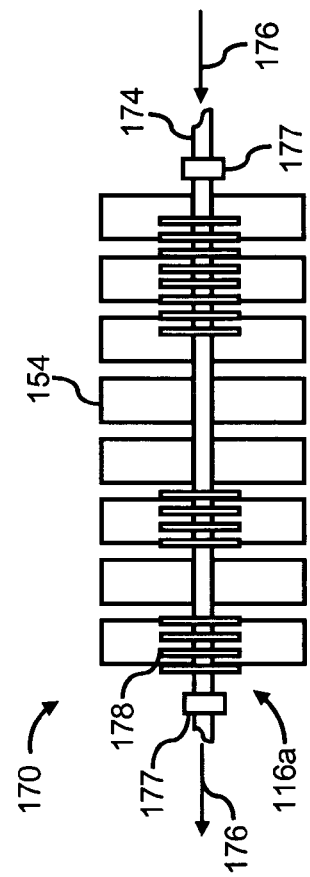

FIGS. 1D-1F depict respective side views 160-164, partially in cross section, of three positions at which the evaporators 116a-116n (only evaporator 116a is shown) may be positioned with respect to heat generating components 154 in the heat generating device 102. The components 154 are illustrated as being positioned on respective supports 156 of the heat generating device 102. The side views 160-164 are provided to illustrate examples of various evaporator 116a positions, but it should be understood that other configurations of the evaporator 116a and the components 154 may be employed without departing from a scope of the refrigeration system 100. For instance, with respect to the side views 160 and 162 depicted in FIGS. 1D and 1E, another evaporator 116n may be positioned above the evaporator 116a, on the opposite side of a component 154, etc. As another example with respect to the side view 164 depicted in FIG. 1F, another evaporator 116n may be positioned at an inlet of a component 154, a fan may be included with the evaporator 116a, etc.

As shown in FIGS. 1D-1F, airflow that flows either into or out of the components 154 are indicated by the arrows 166a and 166b. More particularly, the arrows 166a indicate airflows that pass through or otherwise transfer heat with the evaporator 116a and the airflows that do not pass through or otherwise transfer little or no heat with the evaporator 116a are denoted by the arrows 166b. In addition, the airflows may be assisted in flowing through the components 154 through operation of fans 158. The fans 158 may comprise fans that are integrally formed with the components 154. The positions of the fans 158 depicted in FIGS. 1D-1F are for illustrative purposes only and are thus not meant to limit the components 154 in any respect. The airflows through the components 154 may also be assisted through operation of one or more fans 168 positioned to increase airflow through the evaporator 116a, as shown in FIG. 1D.

The fans 168 may be provided on some or all of the evaporators 116a-116n and may span multiple heat exchangers 116a-116n. In addition, the fans 168 may be removably attached to the evaporators 116a-116n such that the fans 168 may be attached to and removed the evaporators 116a-116n as needed or desired. Alternatively, however, the fans 168 may be substantially permanently attached to the evaporators 116a-116n without departing from a scope of the evaporators 116a-116n.

Figure 1G:
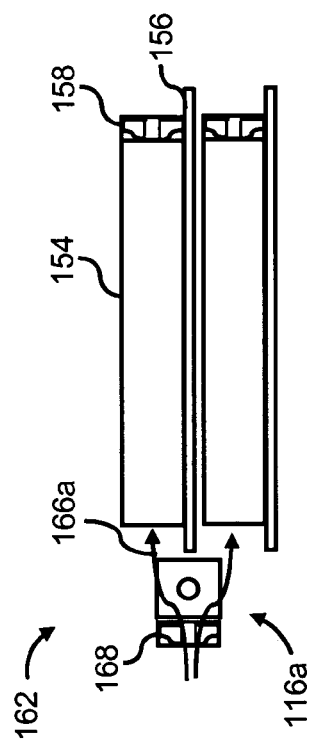
FIG. 1G depicts a view of a position at which evaporators may be positioned with respect to components in the refrigeration system depicted in FIG. 1A, according to an embodiment of the invention.

FIG. 1G illustrates a view 170 of a position at which the evaporators 116a-116n (only evaporator 116a is shown) may be positioned with respect to various components 154. The view 170 may depict either or both of the front and rear views. In this regard, the view 170 may represent either or both of the inlets and outlets of the components 154. It should be understood that the view 170 is merely representative of a possible configuration of the evaporator 116a and that other configurations are possible within the scope of the refrigeration system 100.

As shown in FIG. 1G, the heat exchanger 116a includes a fluid line 174 through which a refrigerant flows. In this respect, the fluid line 174 may comprise the refrigerant line 112. In addition, the refrigerant is configured to flow through the evaporator 116a as depicted by the arrows 176. Positioned along the fluid line 174 is a plurality of fins 178. The fins 178 may be positioned as shown to enable greater heat removal from airflow supplied to or exhausted from particular ones of the components 154. Greater heat removal may be enabled for those components 154 that generate greater amounts of heat. In addition, the fins 178 may be spaced apart from each other to provide spaces of greater airflow for or from those components 154 that may generate lesser amounts of heat. In this regard, for instance, the evaporator 116a may be configured in various respects to generally enable a relatively high level of customization in cooling airflows supplied into or exhausted from the components 154.

Also shown in FIG. 1G are optional couplings 177 that generally enable the evaporator 116a to be removably attached to the fluid line 174. The optional couplings 177 may comprise any reasonably suitable coupling that enables a fluid line, such as a tube, conduit, etc., to be removably attached to another fluid line. The optional couplings 177 may also comprise features that enable the fluid line 174 to be closed when the evaporator 116a is removed or that enable the fluid line 174 to be manually opened and closed.

Generally speaking, the optional couplings 177 may be provided to enable greater flexibility in the positioning of the evaporators 116a-116n. Thus, for instance, through use of the optional couplings 177, evaporators 116a-116n may be positioned along the fluid line 174 as needed or desired with changes in the positions or thermal characteristics of the components 154.

Figure 2:
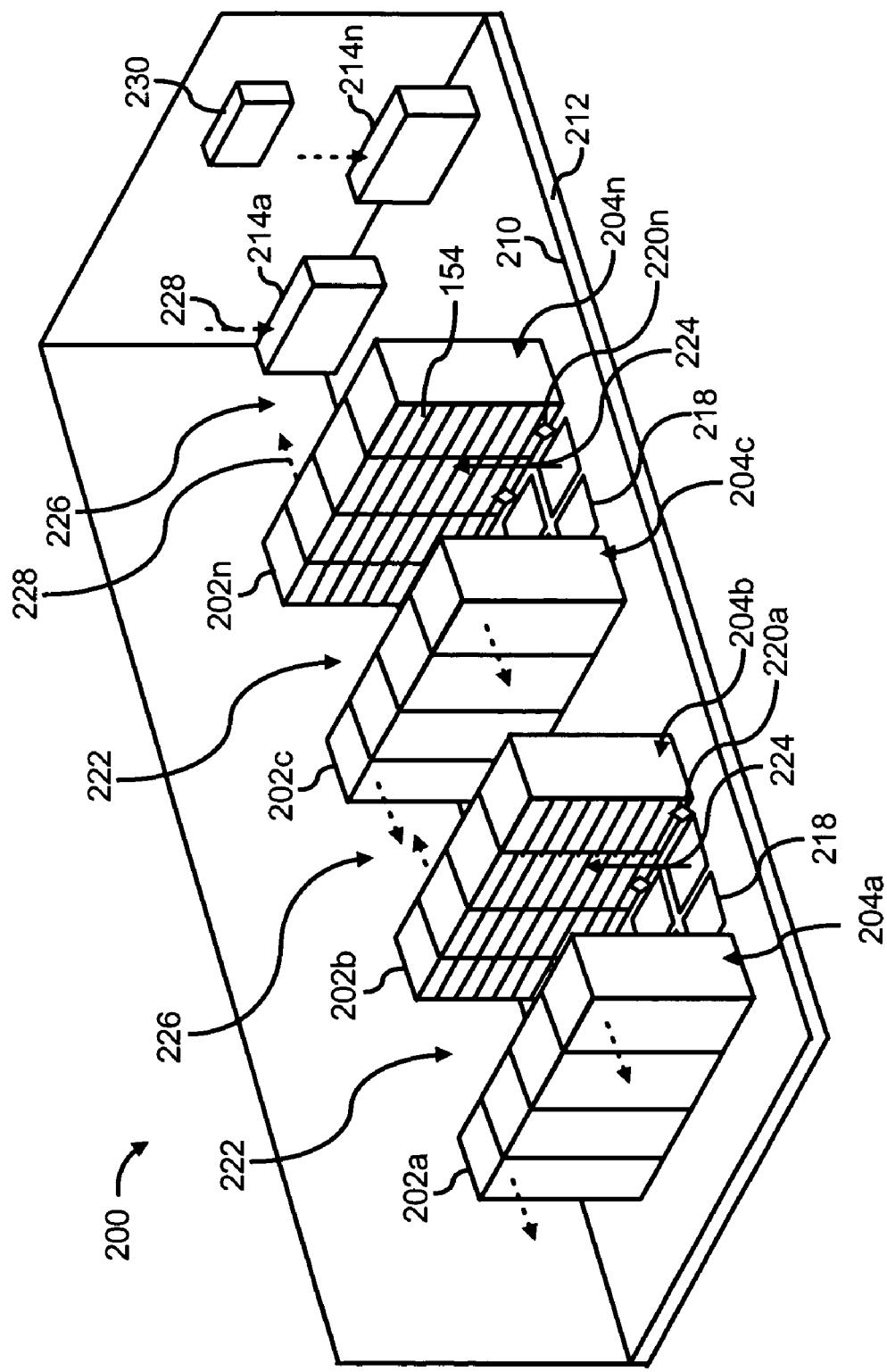
FIG. 2 shows a simplified perspective view of a room containing a number of heat generating devices upon which the refrigeration system depicted in FIG. 1A may be employed, according to an embodiment of the invention.

A number of refrigeration systems 100 may be positioned with respect to one or more heat generating devices 102 contained in a room, as shown, for instance in FIG. 2. More particularly, FIG. 2 shows a simplified perspective view of a section of a room 200 in which the refrigeration system 100 may be implemented. As shown in FIG. 2, the heat generating devices 102 may comprise electronics cabinets or racks 202a-202n housing heat generating components 154, where "n" is an integer equal to or greater than one. As such, one or more of the racks 202a-202n may comprise the configuration of the heat generating device 102 and may include the refrigeration system 100.

The racks 202a-202n are illustrated as being aligned in parallel rows and positioned on a raised floor 210. It should however, be understood that the racks 202a-202n may be arranged in any reasonably suitable configuration and that the racks 202a-202n do not have to be positioned on a raised floor 210. In this regard, for instance, the racks 202a-202n may be positioned in a conventional computer room, such as a data center, or any other reasonably suitable room. The following description of the room 200, however, is directed to a data center environment having a raised floor for purposes of illustration.

The racks 202a-202n are generally configured to house a plurality of components 154 capable of generating/dissipating heat, for instance, processors, micro-controllers, high-speed video cards, memories, semi-conductor devices, and the like. The components 154 may be elements of a plurality of subsystems (not shown), for instance, computers, servers, bladed servers, etc. The subsystems and the components may be operated to perform various electronic functions, for instance, computing, switching, routing, displaying, and the like. A plurality of wires and communication lines (not shown) may be located in a space 212 beneath the raised floor 210. The space 212 may also function as a plenum for delivery of cooled air from one or more actuators.

Also shown in FIG. 2 are air conditioning (AC) units 214a-214n, where "n" is an integer equal to or greater than one. The AC units 214a-214n are generally configured to manipulate a characteristic of the cooled airflow supplied to the racks 202a-202n through actuation of one or more actuators. The actuators may include a device for controlling airflow temperature and a device for controlling the flow rates at which the cooled air is supplied.

The cooled air may be delivered from the space 212 to the racks 202a-202n through vent tiles 218 located between some or all of the racks 202a-202n. The vent tiles 218 may comprise manually or remotely adjustable vent tiles. In this regard, the vent tiles 218 may be manipulated to vary, for instance, the mass flow rates of cooled air supplied to the racks 202a-202n. In addition, the vent tiles 218 may comprise the dynamically controllable vent tiles disclosed and described in commonly assigned U.S. Pat. No. 6,574,104, the disclosure of which is hereby incorporated by reference in its entirety. As described in the U.S. Pat. No. 6,574,104, the vent tiles 218 are termed "dynamically controllable" because they generally operate to control at least one of velocity, volume flow rate and direction of the cooled airflow therethrough. In addition, specific examples of dynamically controllable vent tiles 218 may be found in U.S. Pat. No. 6,694,759, filed on Jan. 27, 2003, which is assigned to the assignee of the present invention and is incorporated by reference herein in its entirety.

The cooled air contained in the space 212 may include cooled air supplied by one or more AC units 214a-214n. Thus, characteristics of the cooled air, such as, temperature, pressure, humidity, flow rate, etc., may substantially be affected by the operations of one or more of the AC units 214a-214n. In this regard, characteristics of the cooled air at various areas in the space 212 and the cooled air supplied to the racks 202a-202n may vary, for instance, due to mixing of the cooled air. In other words, the characteristics of the cooled air supplied to a particular location in the room 200 may differ from that of the cooled air supplied by a single AC unit 214a.

At least one condition, for instance, temperature, pressure, or humidity, of the cooled air supplied to various areas of the room 200 may be detected by sensors 220a-220n, where "n" is an integer equal to or greater than one. As shown, the sensors 220a-220n are represented as diamonds to distinguish them from other elements depicted in FIG. 2. In addition, the sensors 220a-220n are depicted as being positioned to detect the at least one condition at the inlets of the racks 202a-202n. In this example, the sensors 220a-220n may comprise temperature sensors or absolute humidity sensors. In another example, the sensors 220a-220n may be positioned within the space 212 near respective vent tiles 218 to detect the temperature, pressure, or humidity of the cooled air supplied through the respective vent tiles 218. Thus, although the sensors 220a-220n are depicted as being located on the raised floor 210, the sensors 220a-220n may be positioned at various other reasonably suitable locations, including, for example, near or within some or all of the components 154. The sensors 220a-220n may also form part of the evaporators 116a-116n, for instance, on exhaust sides of the evaporators 116a-116n.

The areas between the rows labeled as 204a and 204b and between the rows labeled as 204c and 204n may comprise cool aisles 222. These aisles are considered "cool aisles" because they are configured to receive cooled airflow from the vent tiles 218, as generally indicated by the arrows 224. In addition, and as shown, the racks 202a-202n generally receive cooled air from the cool aisles 222. The aisles between the rows labeled as 204b and 204c, and on the rear sides of rows 204a and 204n, are considered hot aisles 226. These aisles are considered "hot aisles" because they are positioned to receive air that has been heated by the components 154 in the racks 202a-202n, as indicated by the arrows 228.

Although not shown, some or all of the racks 202a-202n may be positioned to each face the same direction, such that there are no distinct "hot aisles" and "cool aisles". Additionally, some or all of the racks 202a-202n may be positioned with their rear sides adjacent to one another. In this example, the vent tiles 218 may be provided in each aisle 222 and 226. In addition, the racks 202a-202n may comprise outlets on top panels thereof to enable heated air to flow out of the racks 202a-202n.

As described herein above, the AC units 214a-214n generally operate to cool heated air (arrows 228) received into the AC units 214a-214n. In addition, the AC units 214a-214n may supply the racks 202a-202n with airflow that has been cooled, through any reasonably suitable known manners and may thus comprise widely available, conventional AC units. For instance, the AC units 214a-214n may comprise vapor-compression type air conditioning units, chilled water air conditioning units, etc. Examples of suitable AC units 214a-214n may be found in co-pending and commonly assigned U.S. patent application Ser. No. 10/853,529, filed on May 26, 2004, and entitled "Energy Efficient AC Unit Operation," the disclosure of which is hereby incorporated by reference in its entirety.

One or more of the racks 202a-202n may include the refrigeration system 100 positioned to either cool airflow supplied into the one or more racks 202a-202n or to cool airflow exhausted from the one or more racks 202a-202n. In this regard, the refrigeration system 100 positioned with respect to the one or more racks 202a-202n may operate to supplement the cooling provided by the AC units 214a-214n. By way of example, the supplemental cooling may be provided to cool airflow delivered to or exhausted from those racks 202a-202n that dissipate comparatively large amounts of heat. As another example, the supplemental cooling may be provided to cool airflow exhausted from racks 202a-202n known to contribute to adverse re-circulation of heated airflow into cooling airflow supplied into the racks 202a-202n.

Also shown in FIG. 2 is a resource manager 230 configured to perform various functions in the room 200. For instance, the resource manager 230 may operate the AC units 214a-214n based upon received information, such as, temperatures at various areas of the room 200. The resource manager 230 may also operate other elements in the room 200, including, for instance, controllable vent tiles 218. In addition or alternatively, the resource manager 230 may operate to control the placement of workload among the components 154 in the room 200.

In certain instances, the resource manager 230 may also be configured to control operations of the refrigeration systems 100. In these instances, the resource manager 230 may operate the refrigeration systems 100 as part of a global control scheme designed, for instance, to substantially minimize energy utilization in the room 200.

Although the resource manager 230 is illustrated in FIG. 2 as comprising a component separate from the components 154 housed in the racks 202a-202n, the resource manager 230 may comprise one or more of the components 154 without departing from a scope of the room 200 disclosed herein. In addition, or alternatively, the resource manager 230 may comprise software configured to operate on a computing device, for instance, one of the components 154.

Figure 3:
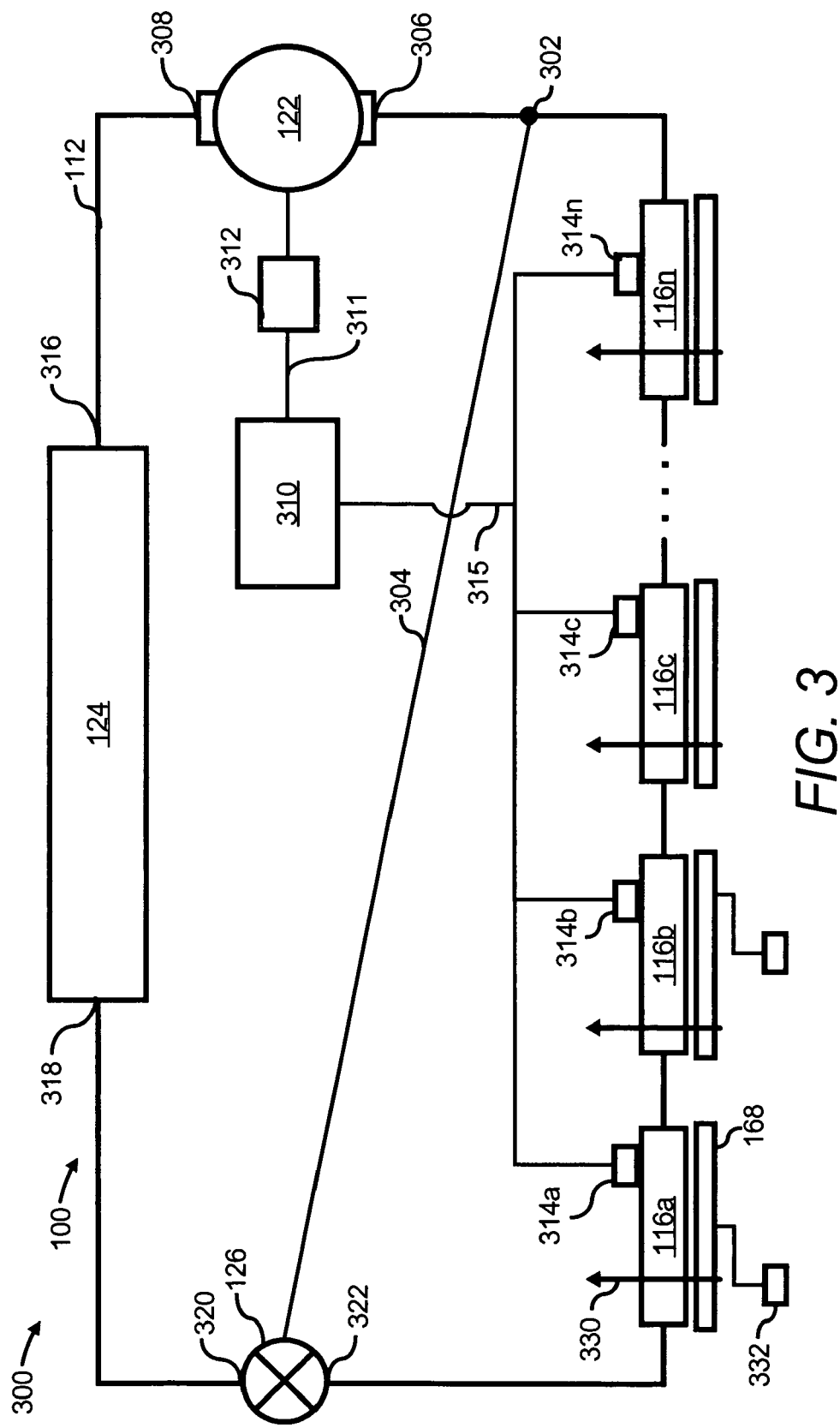
FIG. 3 shows a schematic diagram of a control system for the refrigeration system shown in FIG. 1A, according to an embodiment of the invention.

With reference now to FIG. 3, there is shown a schematic diagram of a control system 300 for the refrigeration system 100, according to a first example. It should be readily apparent to those of ordinary skill in the art that the control system 300 depicted in FIG. 3 represents a generalized illustration and that other components may be added or existing components may be removed or modified without departing from a scope of the control system 300. For example, the control system 300 may include any number of evaporators as well as other components known to be used in refrigeration systems.

The refrigerant in the refrigeration system 100 generally flows through the series of evaporators 116a-116n at a substantially controlled mass flow rate. The term "controlled mass flow rate" in this context refers to the regulation of refrigerant flow through the evaporators 116a-116n, such that the amount of refrigerant flow is generally contingent upon the combined heat loads on the evaporators 116a-116n. More particularly, the mass flow rate of refrigerant flow through the evaporators 116a-116n may be controlled by the valve 126 such that the refrigerant is in an almost entirely gaseous state prior to entering the compressor 122.

By way of example, the valve 126 may comprise a thermostatic expansion valve controllable based upon conditions detected by a superheat sensor 302 located downstream of the evaporators 116a-116n. In this example, the valve 126 may be a regulated needle valve capable of enabling a specified refrigerant superheat to be generated within the refrigerant line 112 between the thermostatic expansion valve 126 and the superheat sensor 302. In this regard, the superheat sensor 302 may modulate the pressure of a fluid within a thermostatic control line 304 in response to a sensed refrigerant temperature such that the thermostatic expansion valve 126 may regulate the mass flow of the refrigerant in refrigerant line 112 to allow adequate superheat to be imparted on the refrigerant and to generally ensure the refrigerant enters the compressor 122 substantially as a gas. However, any reasonably suitable expansion valve that suitably reduces the mass flow rate of the refrigerant fluid, thereby enabling the refrigerant fluid to absorb sufficient heat to ensure that the refrigerant is in a gaseous state upon entering the compressor 122, may be substituted for the thermostatic expansion valve 126 without departing from a scope of the control system 300.

Refrigerant from the evaporators 116a-116n enters the compressor 122 at a compressor inlet 306. The compressor increases the pressure and temperature of the refrigerant before the refrigerant exits through a compressor outlet 308. The compressor 122 may impart some additional heat on the refrigerant as the refrigerant is compressed. In addition, the speed of the compressor 122 and thus the level of compression of the refrigerant may be controlled by a proportional, integral, derivative ("PID") controller 310 with a relay 312, based upon temperatures detected by one or more temperature sensors 314a-314n, which are illustrated as being positioned relative to the airflow paths near respective evaporators 116a-116n.

In one respect, the speed of the compressor 122 may be varied to substantially ensure that the temperature of the refrigerant supplied into the evaporators 116a-116n is at a desired temperature. More particularly, for instance, the PID controller 310 may compare the temperatures detected by the sensors 314a-314n to a setpoint temperature and depending upon the differences between the detected temperatures and the setpoint temperature, the PID controller 310 may transmit a control signal to the variable speed compressor 122 via a control line 311 to vary the refrigerant temperature. Although any suitable PID controller 310 and relay 312 may be utilized with the refrigeration system 100, examples of suitable PID controllers 302 include those manufactured by OMEGA Inc. of Stamford, Conn., and WATLOW ELECTRIC MANUFACTURING CO. of St. Louis, Mo.

The temperature sensors 314a-314n may be positioned, for instance, at an inlet of the heat generating device 102, 202a-202n in the airflow downstream of the evaporators 116a-116n and the setpoint temperature may be set according to the measurements obtained by the temperature sensors 314a-314n. In addition, the temperature sensors 314a-314n may be in wired or wireless communication with the PID controller 310, as indicated by the temperature input line 315.

The setpoint temperature may be set according to the temperature of a processor in a heat generating component 154 or other appropriate system temperature, in which case the temperature sensors 314a-314n may be positioned at various other locations with respect to the heat generating device 102, 202a-202n. In any regard, upon exiting the compressor 122, the refrigerant enters into the condenser 124 through a condenser inlet 316. Heat from the refrigerant may be transferred as described above with respect to FIGS. 1B and 1C. In addition, the refrigerant flows out of the condenser 124 through a condenser outlet 318 and flows into the valve 126 through a valve inlet 320. The valve 126 operates as described above to vary the mass flow rate of refrigerant exiting the valve 126 through a valve outlet 322 prior to being re-supplied through the evaporators 116a-116n.

Generally speaking, therefore, airflow conditions (as represented by the arrows 330), supplied into and/or exhausted from various areas of the heat generating component 102, 202a-202n, may substantially be controlled through manipulation of the variable speed compressor 122 and the valve 126. In addition, the airflow conditions (arrows 330) may be further manipulated through use of one or more fans 168 positioned to increase airflow through the evaporators 116a-116n.

The fans 168 may be set to operate at predefined levels when activated. In addition, or alternatively, the fans 168 may be operated according to a condition detected by, for instance, one or more sensors 332. More particularly, for instance, the fans 168 may include control logic (not shown), such as, a PID controller, a programmable logic controller, etc., configured to operate the fans 168 based upon the conditions detected by the sensor(s) 332. As a further example, fans 168 may be positioned with respect to each of the evaporators 116a-116n and operated at minimum levels to substantially prevent freezing in the evaporators 116a-116n. In any respect, the fans 168 may be controlled in substantially individual manners with respect to each other.

In a first example, the sensor(s) 332 may comprise one or more sensors positioned to take static or differential air pressure measurements around one or more of the evaporators 116a-116n. In this example, the speeds of the fan(s) 168 may be modified according to, for instance, static pressure build up between the evaporator(s) 116a-116n and the component(s) 154.

In a second example, the sensor 332 may comprise one or more sensors configured to detect the temperatures of the components 154, sensors to detect the temperatures or statuses of the refrigerant exiting the evaporators 116a-116n, sensors configured to detect mass airflow rates through a component 154 (either directly measured or through calculations based upon temperature differences across the component 154), etc. In this example, the speeds of the fan(s) may be modified according to one or more of the conditions detected by the sensor(s) 332.

Figure 4:
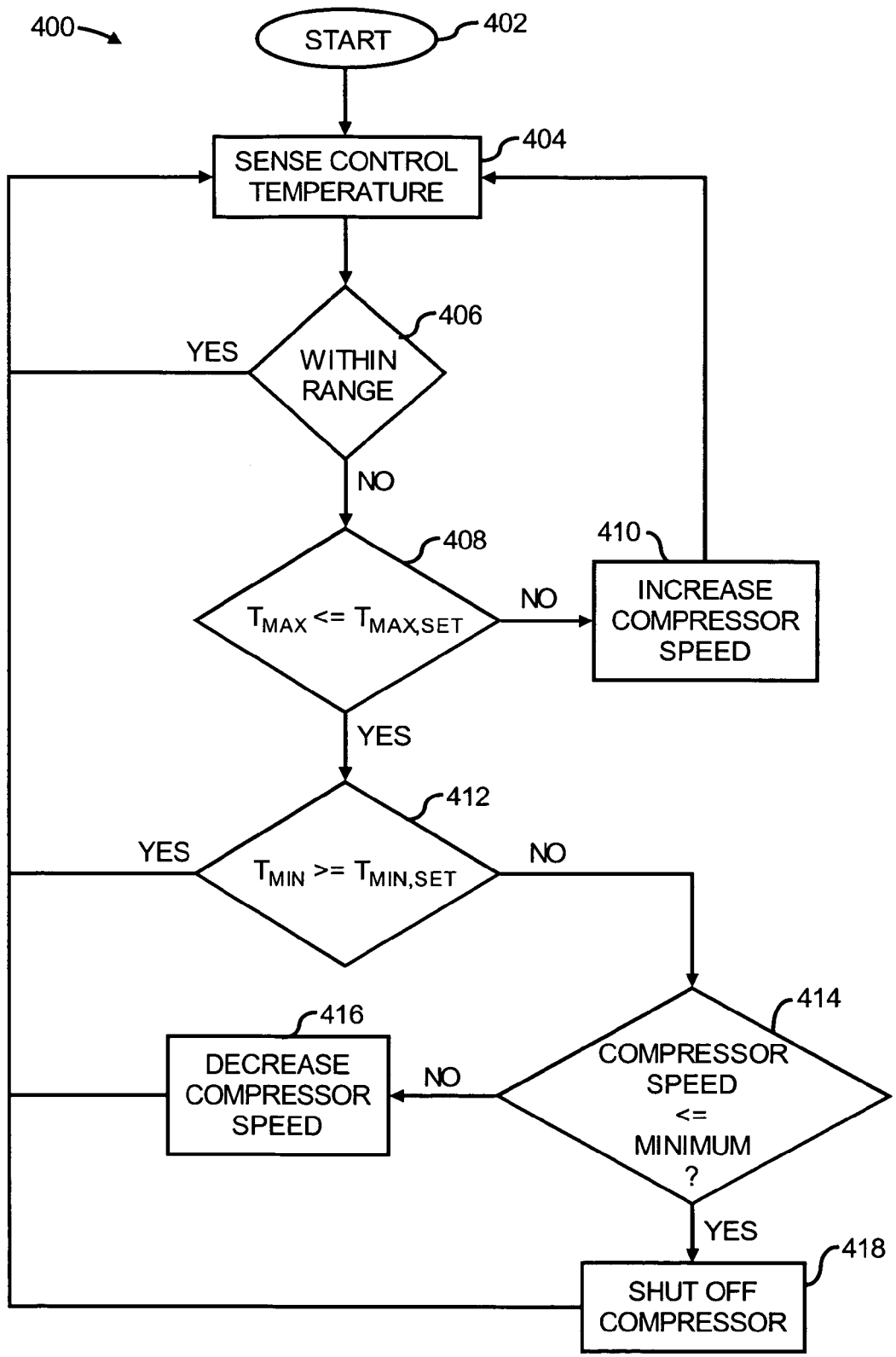
FIG. 4 shows a flow diagram of a method for controlling the airflow around one or more heat generating devices, according to an embodiment of the invention.

Various manners in which the control system 300 may be implemented are described in greater detail with respect to FIG. 4. FIG. 4, more particularly, shows a flow diagram of a method 400 for controlling the airflow around one or more heat generating devices 102, 202a-202n, according to an example. It is to be understood that the following description of the method 400 is but one manner of a variety of different manners in which an example of the refrigeration system 100 may be practiced. It should also be apparent to those of ordinary skill in the art that the method 400 represents a generalized illustration and that other steps may be added or existing steps may be removed, modified or rearranged without departing from a scope of the method 400. Although particular reference to the elements shown in FIG. 3 is made in the description of the method 400, it should be understood that the method 400 is not limited to being implemented by the elements shown in FIG. 3 and may be implemented by more, less, or different elements as those shown in FIG. 3.

Generally speaking, the method 400 may be implemented to substantially control airflow around one or more heat generating devices 102, 202a-202n. More particularly, for instance, the method 400 may be implemented to substantially control the temperature of airflow delivered into one or more of the heat generating devices 102a, 202a-202n to provide one or both of uniform inlet and outlet temperatures. In addition, or alternatively, the method 400 may be implemented to substantially control the temperature of the airflow exhausted from one or more of the heat generating devices 102, 202a-202n. The method 400 may be implemented as a substantially stand-alone airflow control method. In other words, the method 400 may be employed to substantially control airflow around the heat generating devices 102, 202a-202n substantially independently of a larger scale air conditioning unit, such as, the AC units 214a-214n. It should, however, be understood that the method 400 may be implemented in conjunction with larger scale air conditioning units without departing from a scope of the method 400.

The method 400 may be initiated at step 402 in response to any of a number of stimuli or conditions. For instance, the method 400 may be initiated with activation of one or more systems, such as, the refrigeration systems 100, the components 154, the AC units 214a-214n, etc. At step 404, a control temperature may be sensed. In other words, the temperature used by the PID controller 310 in controlling the compressor 122 may be sensed at step 404. As described above, the control temperature may comprise the temperatures detected by the temperature sensors 314a-314n, which may be positioned at one or more locations with respect to one or more heat generating devices 202a-202n. As such, the compressor 122 may be controlled based upon the temperatures detected by a plurality of temperature sensors 314a-314n. The temperatures detected by the one or more temperature sensors 314a-314n may also be transmitted to the PID controller 310 at step 404.

At step 406, the PID controller 310 may determine whether the temperature(s) sensed by the temperature sensors 314a-314n are within a predetermined range. The predetermined range is determined based upon system design and the amount of load variability expected among the heat generating components 154. In general, the predetermined range may depend upon the following: system application, compressor size, thermal response time of evaporators, optimization of the system, refrigerant flow rate, etc.

If the sensed temperatures are within the predetermined range at step 406, the temperatures may be sensed and transmitted to the PID controller 310 again at step 404. If, however, a sensed temperature is determined to be outside of the predetermined range at step 406, the maximum temperature ("$T_{MAX}$") of the measured temperatures is compared to a predetermined maximum temperature set point ("$T_{MAX,SET}$") at step 408. The $T_{MAX,SET}$ may be determined based upon system design and the amount of load variability expected among the heat generating components 154. In general, the $T_{MAX,SET}$ may depend upon the following: component manufactures specifications, system application, proximity to dew point, compressor size, thermal response time of evaporators, optimization of the system, refrigeration flow rate, etc. The $T_{MAX,SET}$ may be determined, for instance, by determining the optimum operating temperatures of the components 154 and is generally a function of component 154 design, airflow efficiency through the components 154, locations of the evaporators 116a-116n with respect to the components 154, and the like. In addition, or alternatively, the $T_{MAX,SET}$ may comprise a predetermined threshold to dew point temperature, for instance, within 1-5 degrees C. of the predetermined threshold. More particularly, for instance, at step 410, the PID controller 310 may compare the temperatures around the evaporators 116a-116n to determine whether the temperatures may cause condensation on the evaporators 116a-116n.

If, at step 408, the $T_{MAX}$ is determined to be greater than the $T_{MAX,SET}$, which equates to a "no" condition, the PID controller 310 may control the compressor 122 via the output line 311 to increase its speed, as indicated at step 410. If, at step 408, the $T_{MAX}$ is determined to be less than or equal to the $T_{MAX,SET}$ which equates to a "yes" condition, the minimum temperature ("$T_{MIN}$") of the measured temperatures is compared to the predetermined minimum temperature used in the control of the compressor 122 ("$T_{MIN,SET}$") at step 412. The $T_{MIN,SET}$ may be determined based upon the system design and the amount of load variability expected among the heat generating components 154. In general, the $T_{MIN,SET}$ may depend upon the following factors: system application, proximity to dew point, compressor size, thermal response time of evaporators, optimization of the system, refrigerant flow rate, etc. In addition, the $T_{MIN,SET}$ may be equivalent to a minimum threshold temperature allowable prior to condensation forming on the evaporators 116a-116n. That is, the $T_{MIN,SET}$ may be equivalent to a threshold temperature related to dew point temperature.

If, at step 412, the $T_{MIN}$ is determined to be greater than or equal to the $T_{MIN,SET}$, the control temperatures are measured again at step 404.

If, at step 412, however, the $T_{MIN}$ is determined to be less than the $T_{MIN,SET}$, the PID controller 310 may determine whether the current speed of the compressor 122 is equal to or below a minimum level, as indicated at step 414. The minimum level may be based upon, for instance, the design and the type of the compressor 122, the design and the type of the cooling coils through which refrigerant from the compressor 122 flows, etc. By way of example, the minimum level may be determined according to manufacturer rated safe operating levels, or the minimum level may be determined through testing of a particular system. In any regard, a determination as to whether the compressor 122 speed is equal to or below the minimum level may be made to substantially prevent the adverse consequences possible when compressors are operated at relatively low levels, such as, for instance, below 15% of their rated maximum levels.

If it is determined that the current speed of the compressor 122 is above the minimum level at step 414, the PID controller 310 may control the compressor 122 via the output line 311 to decrease its speed, as indicated at step 416. If, however, it is determined that the speed of the compressor 122 is equal to or below the minimum level, the PID controller 310 may control the compressor 122 via the output line 311 to shut off the compressor 122, as indicated at step 418. The PID controller 310 may transmit a signal to reactivate the compressor 122, for instance, following a "no" condition at step 408.

Additionally, after each of steps 410, 416 and 418, the control temperatures are measured again at step 404. Moreover, the method 400 may be repeated in a substantially continuous manner to thereby vary operations of the compressor 122 as desired.

Figure 5:
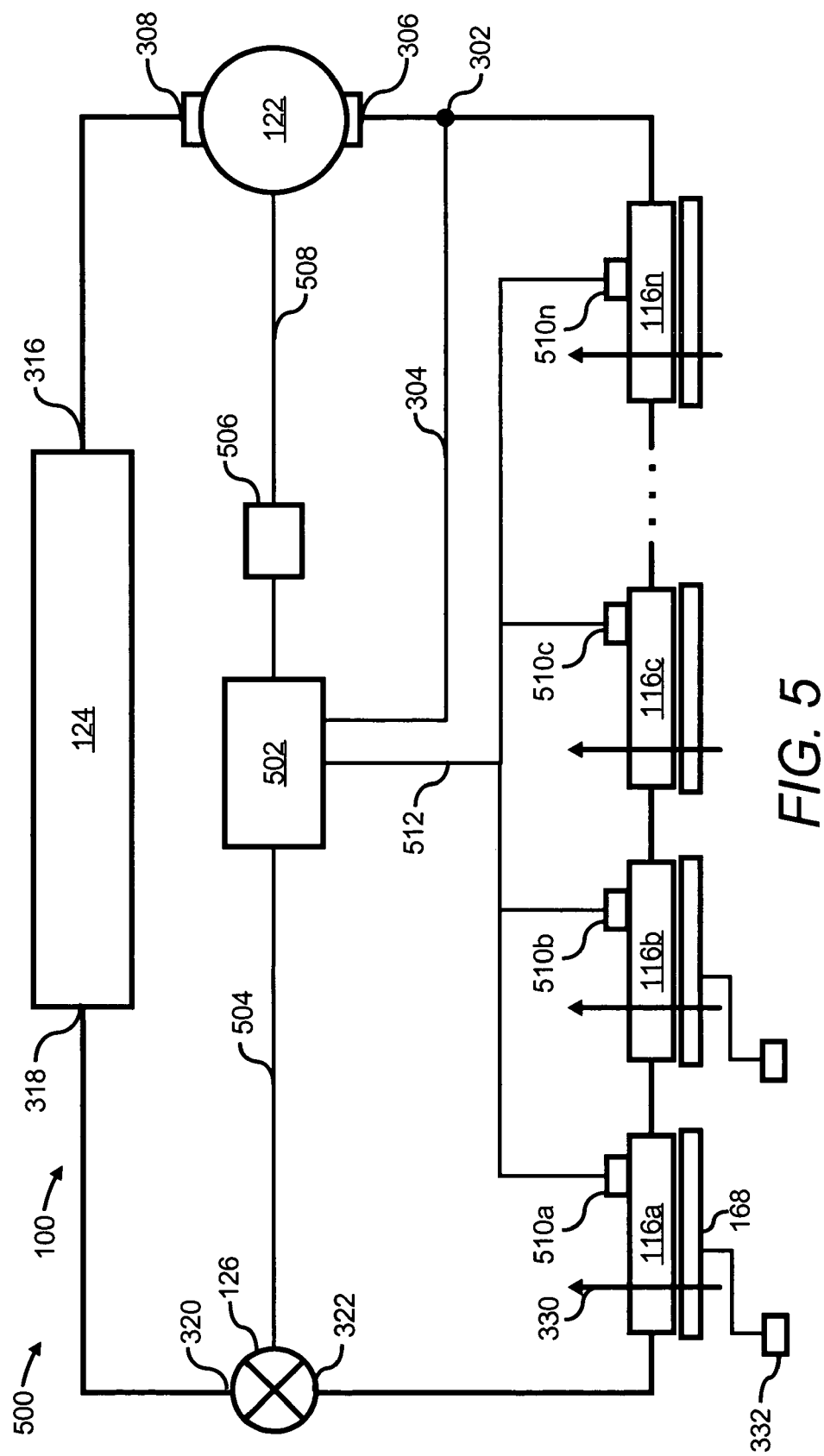
FIG. 5 shows a schematic diagram of a control system for the refrigeration system shown in FIG. 1A, according to another embodiment of the invention.

Turning now to FIG. 5, there is shown a schematic diagram of a control system 500 for the refrigeration system 100, according to another example. It should be readily apparent to those of ordinary skill in the art that the control system 500 depicted in FIG. 5 represents a generalized illustration and that other components may be added or existing components may be removed or modified without departing from a scope of the control system 500. For example, the control system 500 may include any number of evaporators as well as other components known to be used in refrigeration systems.

The control system 500 includes many of the same or similar elements as those depicted in the control system 300 of FIG. 3. As such, those elements having the same reference numerals in FIG. 5 are to be considered as comprising the same elements as those illustrated in FIG. 3. In this regard, a detailed description of those elements sharing common reference numerals is not provided herein with respect to FIG. 5 since they have already been described with respect to FIG. 3.

One distinction between the control systems 300 and 500, however, lies in the manner in which the refrigerant flow through the refrigerant line 112 may be controlled. For instance, as shown in FIG. 5, the control system 500 includes a programmable logic controller ("PLC") 502 configured to control the valve 126 as well as the variable speed compressor 122. In one regard, the valve 126 employed in the control system 500 may comprise an electronic expansion valve capable of being controlled based upon signals received from the PLC 502 over a valve control line 504. It should be understood, however, that any reasonably suitable expansion valve that may be controlled by the PLC 502 may be substituted for the electronic expansion valve 126 without departing from a scope of the refrigeration system 100.

The PLC 502 is also configured to control the variable speed compressor 122 to thereby control the temperature of the refrigerant. The PLC 502 is configured to transmit instructions to the variable speed compressor 122 through a relay 506 and over a compressor control line 508. The relay 506 may be utilized in any well known manner to substantially isolate the relatively high current, utilized to drive the compressor 122, from the typically low current utilized to power the PLC 502. In addition, a relay (not shown) may be employed in similar fashion to control the valve 126.

As shown in FIG. 5, the PLC 502 receives input from a plurality of sources. One of the sources comprises the superheat sensor 302, which is configured to transmit detected superheat temperature information to the PLC 502 over a thermostatic control line 304. The sources also include temperature sensors 510a-510n, which are illustrated as being positioned relative to the airflow paths near respective evaporators 116a-116n. The temperature sensors 510a-510n are illustrated as transmitting detected conditions to the PLC 502 over a temperature input line 512. The temperature sensors 510a-510n may also be in wireless communication with the PLC 502.

The temperature sensors 510a-510n may be positioned, for instance, at an inlet of the heat generating device 102, 202a-202n in the airflow downstream of the evaporators 116a-116n. The setpoint temperature may be set according to the measurements obtained by the thus positioned temperature sensors 510a-510n. Alternatively, the setpoint temperature may be set according to the temperature of a processor in a heat generating component 154 or other appropriate system temperature, in which case the temperature sensors 510a-510n may be positioned at various other locations with respect to the heat generating device 102, 202a-202n.

As described in greater detail below with respect to FIG. 6, the PLC 502 may control the variable speed compressor 122 and the valve 126 based upon the detected condition information received from the sensors 302 and 510a-510n. In one respect, the PLC 502 may control these components to enable a specified refrigerant superheat to be generated within the refrigerant line 112 between the valve 126 and the superheat sensor 302 based upon the temperatures of the airflow around the evaporators 116a-116n. The superheat control may be maintained to generally ensure the refrigerant enters the compressor 122 substantially as a gas. In addition, the PLC 502 may control the speed of the compressor 122 to substantially ensure that the temperature of the refrigerant supplied into the evaporators 116a-116n is at desired temperatures.

Generally speaking, therefore, airflow conditions (as represented by the arrows 330), supplied into and/or exhausted from various areas of the heat generating component 102, 202a-202n, may substantially be controlled through manipulation of the variable speed compressor 122 and the valve 126. In addition, the airflow conditions (arrows 330) may be further manipulated through use of one or more fans 168 positioned to increase airflow through the evaporators 116a-116n, as described in greater detail herein above.

Figure 6:
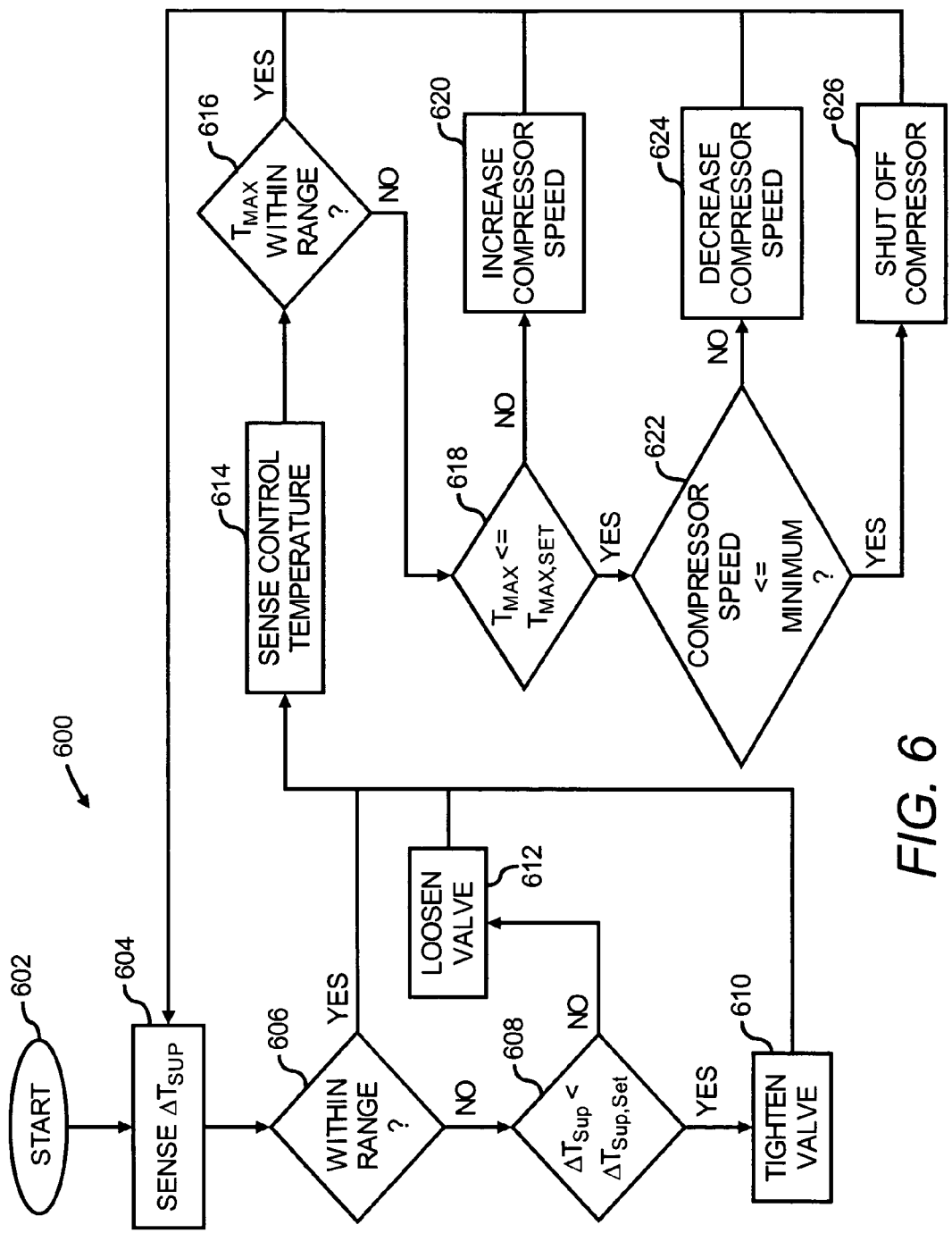
FIG. 6 shows a flow diagram of a method for controlling the airflow around one or more heat generating devices, according to another embodiment of the invention.

Various manners in which the control system 500 may be implemented are described in greater detail with respect to FIG. 6. FIG. 6, more particularly, shows a flow diagram of a method 600 for controlling the airflow around one or more heat generating devices 102, 202a-202n, according to an example. It is to be understood that the following description of the method 600 is but one manner of a variety of different manners in which an example of the refrigeration system 100 may be practiced. It should also be apparent to those of ordinary skill in the art that the method 600 represents a generalized illustration and that other steps may be added or existing steps may be removed, modified or rearranged without departing from a scope of the method 600. Although particular reference to the elements shown in FIG. 5 is made in the description of the method 600, it should be understood that the method 600 is not limited to being implemented by the elements shown in FIG. 5 and may be implemented by more, less, or different elements as those shown in FIG. 5.

Similarly to the method 400, the method 600 may be implemented to substantially control airflow around one or more heat generating devices 102, 202a-202n. The method 600 may be initiated at step 602 in response to any of a number of stimuli or conditions. For instance, the method 600 may be initiated with activation of one or more systems, such as, the refrigeration systems 100, the components 154, the AC units 214a-214n, etc.

Once initiated, the superheat temperature ($\Delta T_{SUP}$) may be sensed by the superheat temperature sensor 302, as indicated at step 604. The sensed $\Delta T_{SUP}$ may also be transmitted to the PLC 502 through the thermostatic control line 304. At step 606, the PLC 502 may determine whether the sensed $\Delta T_{SUP}$ is within a predetermined range. The predetermined range may be determined based upon system design, the amount of load variability expected among the heat generating components 154, etc. In general, the temperature range may depend upon the following factors: system application, compressor size, thermal response time of evaporators, optimization of the system, refrigerant flow rate, etc.

If the sensed $\Delta T_{SUP}$ is determined to be outside of the predetermined range, the sensed $\Delta T_{SUP}$ may be compared to a predetermined setpoint temperature ("$\Delta T_{SUP,SET}$"), as indicated at step 608. If the sensed $\Delta T_{SUP}$ is less than the $\Delta T_{SUP,SET}$, the PLC 502 may manipulate the electronic expansion valve 126 to reduce the flow of refrigerant through the electronic expansion valve 126 at step 610. If the sensed $\Delta T_{SUP}$ is determined to be greater than or equal to the $\Delta T_{SUP,SET}$, the PLC 502 may manipulate the electronic expansion valve 126 to increase the flow of refrigerant through the electronic expansion valve 126 at step 612.

If the sensed $\Delta T_{SUP}$ is determined to be within the predetermined range at step 606, and following each of steps 610 and 612, control temperatures may be sensed by the temperature sensors 510a-510n, as indicated at step 614. The control temperatures may also be transmitted to the PLC 502 through the temperature input line 512.

The PLC 502 may compare the control temperature measurements and determine which of the control temperatures is the maximum temperature ("$T_{MAX}$"). The $T_{MAX}$ may alternatively be determined by performing other calculations on the control temperature measurements, such as averaging the control temperature measurements. At step 616, the PLC 502 may determine whether the $T_{MAX}$ is within a predetermined range. The predetermined range may be determined based upon system design, the amount of load variability expected among the heat generating components 154, etc. In general, the predetermined range may depend upon the following factors: system application, compressor size, thermal response time of evaporators, optimization of the system, refrigerant flow rate, etc.

If the $T_{MAX}$ is within the predetermined range, the $\Delta T_{SUP}$ is measured again at step 604 and the method 600 may be repeated. If the $T_{MAX}$ is determined to be outside of the predetermined range, the $T_{MAX}$ is compared to a predetermined maximum temperature set point ("$T_{MAX,SET}$"), as indicated at step 618. The $T_{MAX,SET}$ may be determined based upon system design and the amount of load variability expected among the heat generating components 154. In general, the $T_{MAX,SET}$ may depend upon the following: component manufacturers specifications, system application, proximity to dew point, compressor size, thermal response time of evaporators, optimization of the system, refrigeration flow rate, etc.

If, at step 618, the $T_{MAX}$ is determined to be greater than the $T_{MAX,SET}$, which equates to a "no" condition, the PLC 502 may control the compressor 122 via the compressor control line 508 to increase its speed, as indicated at step 620. If, at step 618, the $T_{MAX}$ is determined to be less than or equal to the $T_{MAX,SET}$, which equates to a "yes" condition, the PLC 502 may determine whether the current speed of the compressor 122 is equal to or below a minimum level, as indicated at step 622. The minimum level may be based upon, for instance, the design and the type of the compressor 122, the design and the type of the cooling coils through which refrigerant from the compressor 122 flows, etc. By way of example, the minimum level may be determined according to manufacturer rated safe operating levels, or the minimum level may be determined through testing of a particular system. In any regard, a determination as to whether the compressor 122 speed is equal to or below the minimum level may be made to substantially prevent the adverse consequences possible when compressors are operated at relatively low levels, such as, for instance, below 15% of their rated maximum levels.

If it is determined that the current speed of the compressor 122 is above the minimum level at step 622, the PLC 502 may control the compressor 122 via the compressor control line 508 to decrease its speed, as indicated at step 624. If, however, it is determined that the speed of the compressor 122 is equal to or below the minimum level, the PLC 502 may control the compressor 122 via the compressor control line 508 to shut off the compressor 122, as indicated at step 626. The PLC 502 may transmit a signal to reactivate the compressor 122, for instance, following a "no" condition at step 618.

Additionally, after each of steps 620, 624, and 626, the $\Delta T_{SUP}$ may again be measured at step 604 and the method 600 may be repeated as desired.

The operations set forth in one or both of the methods 400 and 600 may be contained as a utility, program, or subprogram, in any desired computer accessible medium. In addition, one or both of the methods 400 and 600 may be embodied by a computer program, which can exist in a variety of forms both active and inactive. For example, it can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 7:
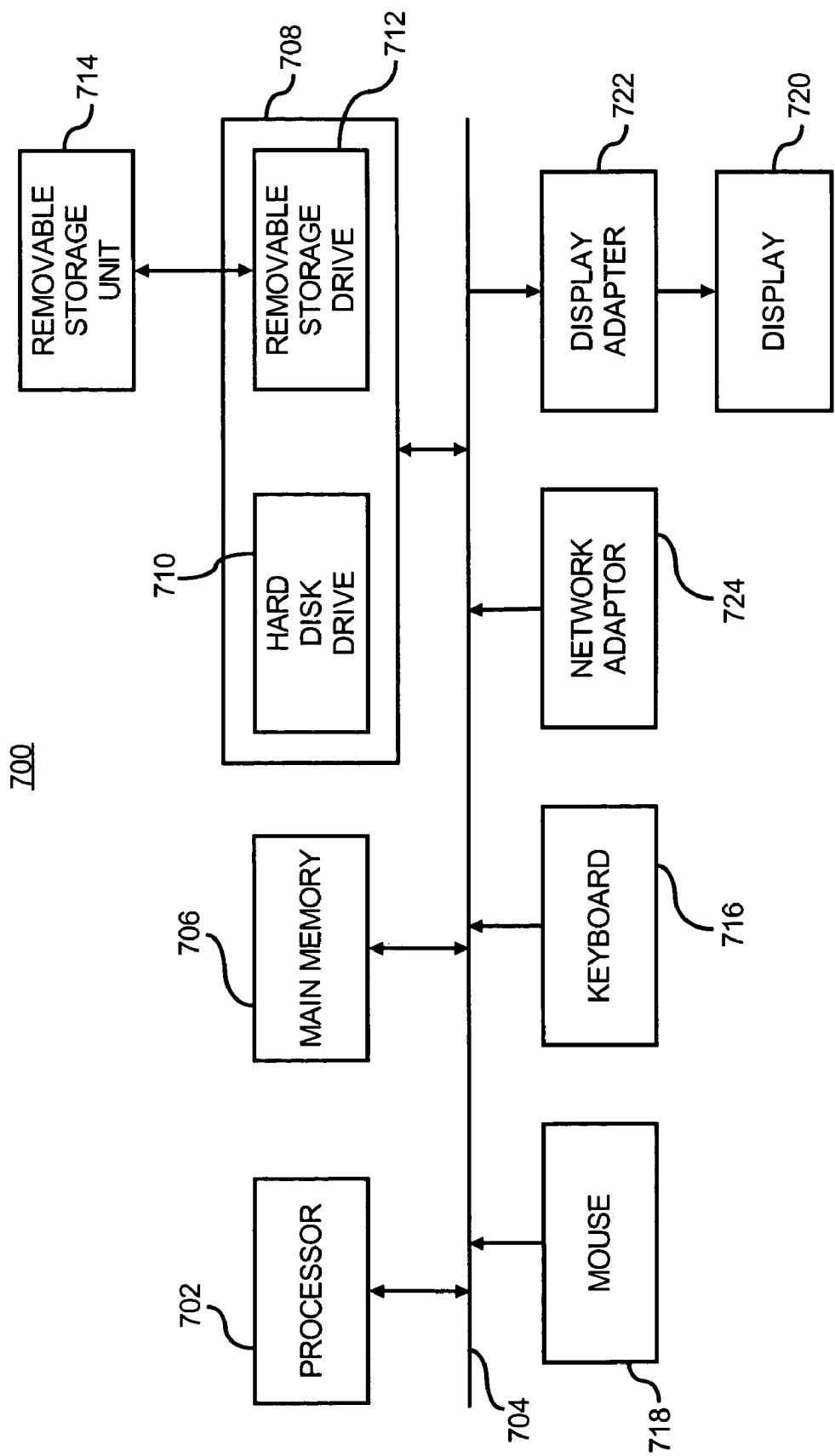
FIG. 7 illustrates a computer system, which may be employed to perform the various functions of the control system depicted in FIG. 5, according to an embodiment of the invention.

FIG. 7 illustrates a computer system 700, which may be employed to perform the various functions of one or both of the PID controller 302 and the PLC 502 described hereinabove, according to an embodiment. In this respect, the computer system 700 may be used as a platform for executing one or more of the functions described hereinabove with respect to one or both of the PID controller 302 and the PLC 502.

The computer system 700 includes one or more controllers, such as a processor 702. The processor 702 may be used to execute some or all of the steps described in one or both of the methods 400 and 600. Commands and data from the processor 702 are communicated over a communication bus 704. The computer system 700 also includes a main memory 706, such as a random access memory (RAM), where the program code for, for instance, the PLC 502, may be executed during runtime, and a secondary memory 708. The secondary memory 708 includes, for example, one or more hard disk drives 710 and/or a removable storage drive 712, representing a floppy diskette drive, a magnetic tape drive, a compact disk drive, etc., where a copy of the program code for one or both of the methods 400 and 600 may be stored.

The removable storage drive 710 reads from and/or writes to a removable storage unit 714 in a well-known manner. User input and output devices may include a keyboard 716, a mouse 718, and a display 720. A display adaptor 722 may interface with the communication bus 704 and the display 720 and may receive display data from the processor 702 and convert the display data into display commands for the display 720. In addition, the processor 702 may communicate over a network, for instance, the Internet, LAN, etc., through a network adaptor 724.

It will be apparent to one of ordinary skill in the art that other known electronic components may be added or substituted in the computer system 700. In addition, the computer system 700 may include a system board or blade used in a rack in a data center, a conventional "white box" server or computing device, etc. Also, one or more of the components in FIG. 7 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. An electronics cabinet for housing a plurality of air-cooled electronic components, said electronics cabinet comprising:
   an inlet section through which air is configured to flow into the electronics cabinet;
   an outlet section through which air is configured to flow out of the electronics cabinet; and
   a refrigeration system for controlling airflow around the electronics cabinet through at least one of the inlet section and the outlet section, said refrigeration system comprising,
      a refrigerant line positioned in at least one of the inlet section and the outlet section;
      a variable speed compressor for controlling the flow of refrigerant through the refrigerant line;
      evaporators positioned along the refrigerant line in a serial configuration with respect to each other, said evaporators being positioned in the at least one of the inlet section and the outlet section directly in at least one of the path of airflow supplied into the electronics cabinet and the path of airflow exhausted from the electronics cabinet;
      a controller for controlling the speed of the variable speed compressor; and
      at least one temperature sensor positioned to detect air temperatures at one or more locations with respect to the electronics cabinet, said at least one temperature sensor also being configured to transmit signals related to the detected air temperature to the controller, wherein the controller is configured to vary the speed of the variable speed compressor based upon the signals received from the at least one temperature sensor.

2. The refrigeration system according to claim 1, further comprising:

a sensor for detecting superheat temperature of the refrigerant exiting the evaporators; and an expansion valve positioned upstream of the evaporators, said expansion valve being configured to control the flow of refrigerant supplied into the evaporators based upon the detected superheat temperature in the refrigerant.

3. The refrigeration system according to claim 2, further comprising:

a thermostatic control line connecting the sensor for detecting superheat and the expansion valve; and wherein said expansion valve comprises a thermostatic expansion valve, said thermostatic control line comprising a fluid configured to vary the mass flow rate of refrigerant flow through the expansion valve based upon the superheat temperature of the refrigerant.

4. The refrigeration system according to claim 3, wherein the controller comprises a proportional, derivative, integral controller with a relay.

5. The refrigeration system according to claim 2, wherein the expansion valve comprises an electronic expansion valve and wherein the controller comprises a programmable logic controller configured to control the electronic expansion valve.

6. The refrigeration system according to claim 2, further comprising:

a condenser positioned downstream of the variable speed compressor;

a chilled fluid source comprising a heat exchanger portion and a heat exchanger valve, said heat exchanger portion being positioned to remove heat from the condenser and said heat exchanger valve being operable to vary the flow of chilled fluid through the heat exchanger to substantially optimize efficiency of the variable speed compressor.

7. The electronics cabinet according to claim 1, said electronics cabinet being configured to house a plurality of heat generating components, wherein the heat generating components have inlets for receiving airflow, and wherein the evaporators are positioned upstream of the inlets to thereby cool airflow supplied into the heat generating components.

8. The electronics cabinet according to claim 1, said electronics cabinet being configured to house a plurality of heat generating components, wherein the heat generating components have outlets for exhausting airflow, and wherein the evaporators are positioned downstream of the outlets to thereby cool airflow exhausted from the heat generating components.

9. The electronics cabinet according to claim 1, further comprising:

a movable door positioned on at least one of the inlet section and the outlet section, wherein the evaporators are positioned on the movable door.

10. The refrigeration system according to claim 1, further comprising:

at least one fan positioned with respect to the evaporators for increasing airflow through the evaporators.

11. The refrigeration system according to claim 1, wherein at least one of the evaporators is attached along the refrigerant line through couplings configured to removably attach the at least one of the evaporators to the refrigerant line.

12. The electronics cabinet according to claim 1, wherein the electronics cabinet houses a plurality of electronic components.

13. An electronics cabinet comprising:

an inlet section through which air is configured to flow into the electronics cabinet;

an outlet section through which air is configured to flow out of the electronics cabinet;

means for enabling refrigerant flow through evaporators positioned in at least one of the inlet section and the outlet section, said evaporators being positioned in a serial arrangement with respect to each other and directly in the path of at least one of airflow supplied into the electronics cabinet and airflow exhausted from the electronics cabinet to cool airflow around components housed in the electronics cabinet;

means for detecting a superheat temperature of the refrigerant downstream of the evaporators;

means for metering refrigerant flow through the evaporators based upon the detected superheat temperature;

means for detecting temperature of airflow around the electronics cabinet; and means for variably controlling the temperature of the refrigerant, said means for variably controlling the temperature being configured to vary the temperature based upon the detected airflow temperature.

* * * * *